(12) United States Patent
Cox et al.

(10) Patent No.: US 8,785,793 B2
(45) Date of Patent: *Jul. 22, 2014

(54) MODULAR SEALED PORTABLE DIGITAL ELECTRONIC CONTROLLER

(75) Inventors: Timothy R. Cox, Waldron, AR (US); Ronald T. Pagan, Alma, AR (US); Stephen S. Newell, Fort Smith, AR (US); Steve D. Tull, Waldron, AR (US)

(73) Assignee: Weightech, Inc., Waldron, AR (US)

( * ) Notice: Subject to any disclaimer, the term of this patent is extended or adjusted under 35 U.S.C. 154(b) by 676 days.

This patent is subject to a terminal disclaimer.

(21) Appl. No.: 12/924,239

(22) Filed: Sep. 23, 2010

(65) Prior Publication Data

US 2011/0017522 A1  Jan. 27, 2011

Related U.S. Application Data

(60) Continuation of application No. 12/154,914, filed on May 28, 2008, now abandoned, which is a continuation of application No. 11/198,110, filed on Aug. 5, 2005, now Pat. No. 7,397,003, which is a division of application No. 10/345,566, filed on Jan. 16, 2003, now Pat. No. 7,002,084.

(60) Provisional application No. 60/350,297, filed on Jan. 16, 2002.

(51) Int. Cl.
*G01G 21/28* (2006.01)
*H05K 5/02* (2006.01)

(52) U.S. Cl.
USPC ......... 177/238; 174/50.52; 361/752; 361/736

(58) Field of Classification Search
USPC ............. 177/238; 174/50.52, 50.53, 52.2; 361/752, 736; 235/145 R; 400/714
See application file for complete search history.

(56) References Cited

U.S. PATENT DOCUMENTS

| | | | |
|---|---|---|---|
| 3,444,943 A | 5/1969 | Tytus | |
| 3,898,537 A | 8/1975 | Mayse et al. | |
| 4,219,089 A | 8/1980 | Gard et al. | |
| 4,285,412 A | 8/1981 | Wirth | |
| 4,313,509 A | 2/1982 | Engels | |
| 4,320,809 A | 3/1982 | Knothe et al. | |
| 4,497,038 A | 1/1985 | Diepold-Scharnitzky et al. | |
| 4,526,246 A | 7/1985 | Patoray | |
| 4,632,199 A | 12/1986 | Ober et al. | |

(Continued)

FOREIGN PATENT DOCUMENTS

EP 0 825 810 B1 3/1999

*Primary Examiner* — Randy W Gibson
(74) *Attorney, Agent, or Firm* — Speed Law Firm

(57) ABSTRACT

An electronic digital controller, such as a load cell indicator, is disclosed in which a number of components, such as a circuit board, display, and keypad are placed within an enclosure, and the enclosure is bonded closed, such as using an adhesive, to render the enclosure watertight. The keypad is a touch sensitive, capacitive keypad with no moving parts, and it is housed behind a rigid panel. An optoelectronic transceiver allows for data exchange with an electronic memory device housed in the adhesively sealed enclosure and allows for data exchange and for updating or modification of software code housed therein. Other components, such as another circuit board, a power supply, and block connectors, are placed in an adjacent enclosure, and the circuit boards in the two enclosures are electrically connected. The power supply is preferably a potted AC power supply but may also include a battery.

29 Claims, 5 Drawing Sheets

(56) References Cited

U.S. PATENT DOCUMENTS

| | | | |
|---|---|---|---|
| 4,651,133 | A | 3/1987 | Ganesan et al. |
| 4,703,161 | A | 10/1987 | McLean |
| 4,924,222 | A | 5/1990 | Antikidis et al. |
| 4,969,112 | A | 11/1990 | Castle |
| 4,992,775 | A | 2/1991 | Castle et al. |
| 5,077,536 | A | 12/1991 | Fichot et al. |
| 5,121,328 | A | 6/1992 | Sakai et al. |
| 5,241,488 | A | 8/1993 | Chadima, Jr. et al. |
| 5,241,695 | A | 8/1993 | Roshitsh et al. |
| 5,471,885 | A | 12/1995 | Wagner |
| 5,545,494 | A | 8/1996 | Trumble et al. |
| 5,568,365 | A | 10/1996 | Hahn et al. |
| 5,611,616 | A | 3/1997 | Chandler |
| 5,623,128 | A | 4/1997 | Grimm et al. |
| 5,748,727 | A * | 5/1998 | Lundell et al. ............... 379/446 |
| 5,821,405 | A | 10/1998 | Dickey et al. |
| 5,841,077 | A | 11/1998 | Kolaci |
| 5,901,034 | A | 5/1999 | Fuglister |
| 5,931,297 | A | 8/1999 | Weill et al. |
| 6,007,351 | A | 12/1999 | Gabrisko, Jr. et al. |
| 6,058,356 | A | 5/2000 | Swanson et al. |
| 6,061,446 | A | 5/2000 | Lester et al. |
| 6,160,647 | A | 12/2000 | Gilliand et al. |
| 6,229,892 | B1 | 5/2001 | Johnson et al. |
| 6,304,455 | B1 | 10/2001 | Huber et al. |
| 6,307,751 | B1 | 10/2001 | Bodony et al. |
| 6,309,257 | B1 | 10/2001 | Huang |
| 6,351,535 | B1 * | 2/2002 | Nogas et al. ............... 379/436 |
| 6,359,239 | B1 | 3/2002 | Missler et al. |
| 6,376,783 | B1 | 4/2002 | Vaghi |
| 6,407,911 | B1 | 6/2002 | Spence et al. |
| 6,452,514 | B1 | 9/2002 | Philipp |
| 6,484,107 | B1 | 11/2002 | Roper et al. |
| 6,511,337 | B1 | 1/2003 | Fandrey et al. |
| 6,546,265 | B1 | 4/2003 | Okuda |
| 6,546,805 | B2 | 4/2003 | Fandrey et al. |
| 6,639,156 | B2 | 10/2003 | Luke et al. |
| 6,686,717 | B2 | 2/2004 | Khairallah |
| 6,731,913 | B2 | 5/2004 | Humphreys et al. |
| 7,002,084 | B2 | 2/2006 | Cox et al. |
| 2005/0269140 | A1 | 12/2005 | Cox et al. |
| 2006/0054335 | A1 | 3/2006 | Rapp et al. |

* cited by examiner

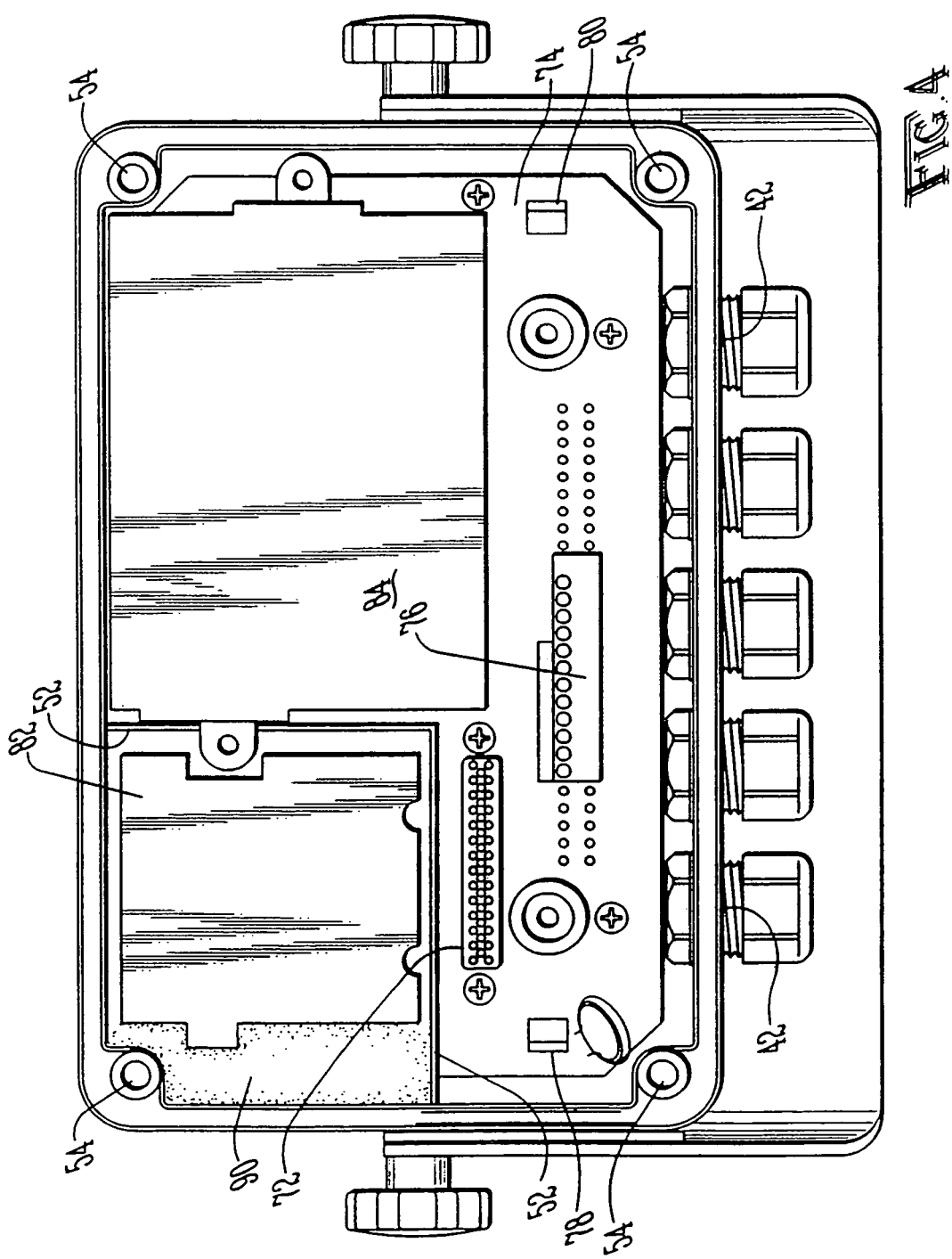

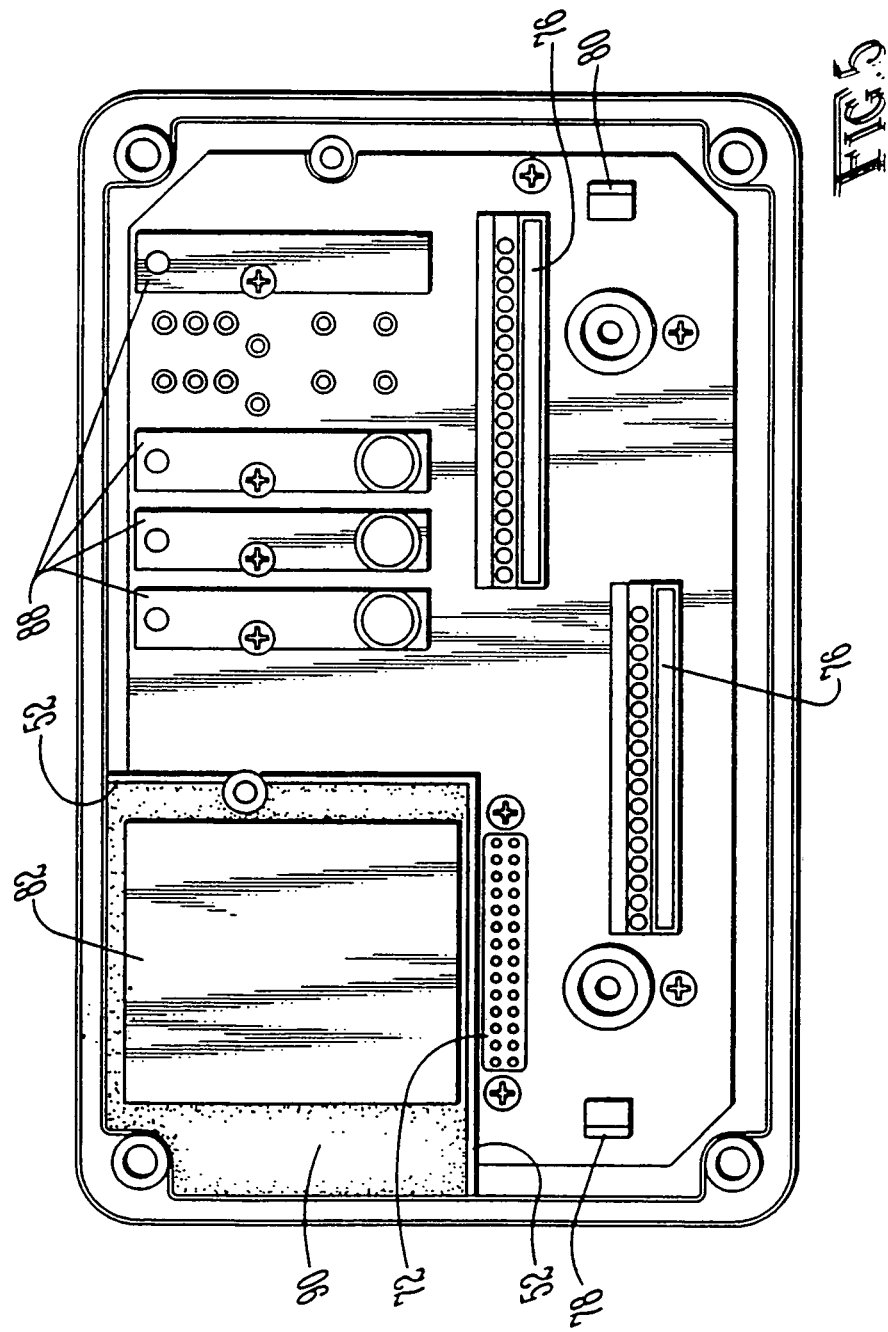

MODULAR SEALED PORTABLE DIGITAL ELECTRONIC CONTROLLER

CROSS-REFERENCE TO RELATED APPLICATIONS

This application is a continuation of co-pending U.S. patent application Ser. No. 12/154,914 filed on May 28, 2008 and having the inventors Timothy R. Cox, et al., which is a continuation of U.S. patent application Ser. No. 11/198,110 filed on Aug. 5, 2005 and having the inventors Timothy R. Cox, et al., now U.S. Pat. No. 7,397,003 issued on Jul. 8, 2008, which is a divisional of U.S. patent application Ser. No. 10/345,566 filed Jan. 16, 2003, now U.S. Pat. No. 7,002,084 issued on Feb. 21, 2006, which claims benefit of U.S. Provisional Patent Application Ser. No. 60/350,297 filed Jan. 16, 2002. Each of the aforementioned related patent applications and patents is herein incorporated by reference.

BACKGROUND OF THE INVENTION

This invention relates to digital electronic controllers and, more particularly, to portable digital electronic load cell indicators.

Measuring transducers are known in the art and are used to measure forces associated with any number of applications involving such things as weight, gravity, pressure, and vibration. A load cell is a common measuring transducer that is typically used in a wide variety of scales or weighing systems. A load cell typically generates an analog signal that is converted to a digital signal before being displayed or otherwise processed or used. An electronic controller, such as a load cell indicator, is typically used to display data received from a load cell and is often used to convert the data from analog to digital format before the data is displayed or used.

Load cell indicators are well known. Most have common weaknesses that present problems particularly when the load cell indicators are used in rough, washdown environments. In some environments, such as poultry processing facilities, the indicators may be handled roughly and with disdain. Cleaning crews may aim high pressure spray guns spraying hot cleaning solution at electronic instruments for sport. This high pressure spray will often seep past gaskets and seals, leaving the internal electrical connectors and electronic components wet. Since the cleaning solutions used are typically slightly conductive, any solution that finds its way to the incoming AC power connector will often result in damage, which can range from minor corrosion of wiring and printed circuit board traces to arc-over and destruction of the AC power connector and related circuitry. This damage often limits the useful life of an instrument to mere weeks.

The personnel using the indicator as part of their daily job function may also be handling sharp pointed instruments, such as knives or scissors. They quite often use the sharp instrument instead of a finger to press buttons on a keypad. If the indicator uses a plastic membrane keypad, which is by far the most common type of front panel found on load cell indicators, this activity will quickly result in a damaged keypad. Depending on the design on the specific indicator, a damaged keypad may be replaced, or it may mean replacement of the entire indicator. Again, this potential for damage limits the lifetime of indicators in some environments.

To prevent damage from the user or the environment, some load cell indicators are mounted inside another enclosure, often with a latching flip-up transparent front lid, allowing the user to see the display. To access any of the front panel controls, the user must first unlatch the lid, lift it up, and finally press the desired key. While this style of double enclosure mounting may reduce high pressure fluid infiltration in the indicator enclosure, it also limits operator access to the indicator, sometimes excessively so. The effectiveness of this mounting style is frequently reduced by the tendency of operators to forget to latch the front lid, leaving the indicator exposed to the very high pressure spray the lid was intended to prevent.

Most digital load cell indicators have some type of display to present weight information to the user. The choice of display can be problematic, as many display types with outstanding visibility (such as a vacuum florescent display—VFD) have high power consumption. Indicators that use VFDs often have no provision for running from battery power, limiting their usefulness as a portable device. Other indicators use seven-segment light emitting diode (LED) displays, which provide good visibility and reasonable power consumption, but the seven-segment style of digit is not conducive to presenting alphanumeric data to the user. Indicators with seven segment displays are thus limited in displaying information, which makes setup and troubleshooting cryptic and difficult. LCD (liquid crystal display) technology is also used in load cell indicators. LCDs are very low power consumption devices. LCDs are also available in character mode and dot-matrix configurations, which allow the presentation of alphanumeric data and even graphic information in an easily readable style. However, many digital load cell indicators use LCD modules that require ambient light for the display to be visible to the user, which makes the instrument difficult to use in dark or uncertain lighting.

Load cell indicators designed for use in washdown environments are often housed in stainless steel enclosures to resist corrosion. High temperature washdown followed by extended use in cold temperature environments can lead to condensation forming on the enclosure. If the seals around the cables, display, and keypad are less than perfect, and they usually are, condensation can also form on the inside of the enclosure, which can wet the electronic components, circuit boards, and connectors. Display fogging is also common in this situation. These conditions conspire to limit the effectiveness of the indicator.

Load cell indicator enclosures designed for washdown environments are sometimes designed with many closely-spaced fasteners and gaskets to prevent or reduce high pressure fluid infiltration. If internal access to the enclosure is desired, such as to replace a load cell cable or power cable, the technician performing the procedure will spend quite a bit of time and frustration removing all the fasteners and sealing material to gain access to the internal connections of the indicator.

Very few load cell indicators are designed to interface with more than one independent load cell. This limitation leads to the use of external hardware, such as summing boxes, to condition multiple load cell signals (as might be provided by a large tank or platform scale) for use with common indicators. Summing boxes are generally passive devices, with potentiometers that must be manually adjusted to ensure that each load cell contributes equally to the summed analog signal. It is not uncommon for a scale technician to spend hours manually adjusting a single load cell summing box to allow an indicator to accurately weigh when connected to a multiple load cell platform.

Some load cell indicators have provisions for interfacing with other instruments, such as bar code label printers, data collection devices, or computer hardware. This connection is often through a serial communications port. Depending on the requirement of the user, the data transfer format between the load cell indicator and other auxiliary instruments, may have to be customized to the user's specific installation and circumstances. For many load cell indicators, this is simply not possible, as there is no allowance for field customization of the software code contained inside the indicator controller, and the manufacturers are unable to update software once the indicator has been manufactured.

Advanced or high-end load cell indicators may be used as weighing machine controllers, in which case they are often integrated into other, more complicated machines. These machines might consist of several load cells, other load cell indicators, various valves, slides, gates, and motor drives, sometimes from a diverse group of manufacturers. During integration and testing, problems, bugs, or unforeseen circumstances will often arise that require the machine controller software to be modified. If the advanced load cell indicator/controller is not designed with this in mind, the upgrade might require significant disassembly of the indicator and associated hardware to replace a physical electronic device containing the controller software.

Many users of load cell indicators desire a small, portable instrument that can be mounted on a load cell platform and that can be carried by hand. This requirement limits the overall size and weight of the instrument and also requires a portable power source, such as a battery. Many load cell indicators do not have any provision for a battery. Some do, but require so much power that the only practical option is a physically large battery mounted external to the indicator enclosure. Any externally mounted battery will require wiring to provide power to the indicator, and that wiring introduces at least two additional weaknesses into the system: the wiring must be sealed to prevent leakage where it enters the indicator enclosure, and exposed wiring is vulnerable to damage.

Load cell indicators used in harsh environments are often damaged. When this occurs, many users will desire to troubleshoot the indicator to determine the cause of the failure, and then will often elect to attempt a repair. Load cell indicators are relatively complicated and include delicate electronic instruments, so troubleshooting may call for the use of skilled electronic technicians and other highly trained and costly personnel equipped with an assortment of specialized tools. If the indicator does not have adequate documentation or if spare parts are not easily available, it may be more economical to replace the entire indicator rather than to repair it. A user or technician who may attempt troubleshooting but who may lack the proper training or the right tools can often do more harm than good when provided with ready access to all of the electronic components of these relatively complex, delicate instruments.

All load cell indicators will require calibration to accurately weigh when interfaced with a specific load cell. Indicators are also calibrated at regular periods of time to meet various legal, trade, and internal requirements. Many load cell indicators are difficult to calibrate. The indicator calibration procedure may require various internal switches and potentiometers to be manually adjusted in a very fine and precise manner. The calibration procedure may require an exact value of weight to be applied to the scale. Some indicators have a rather lengthy and complicated calibration procedure that is not obvious without supplemental documentation, so if the calibration procedure instructions are misplaced, that scale is unusable.

SUMMARY OF THE INVENTION

It is therefore an object of the present invention to provide a digital electronic controller, such as a load cell indicator, that is particularly suited for use in a harsh washdown environment.

It is a further object of the present invention to provide a load cell indicator of the above type that protects many key, sensitive components of the indicator by permanently sealing them within a watertight enclosure such as by using an adhesive seal.

It is a further object of the present invention to provide a load cell indicator of the above type that protects against moisture coming into contact with high voltage within the indicator.

It is a further object of the present invention to provide a load cell indicator of the above type that reduces the risk of damage to a keypad used in connection with the indicator.

It is a still further object of the present invention to provide a load cell indicator of the above type that eliminates the keypad as a possible point entry for water or moisture.

It is a still further object of the present invention to provide a load cell indicator of the above type that allows a user access to the keypad without the need to open or close a lid or separate housing.

It is a still further object of the present invention to provide a load cell indicator of the above type having a display that offers very low power consumption while allowing the presentation of alphanumeric data and graphic information in an easily readable style in a variety of lighting conditions.

It is a still further object of the present invention to provide a load cell indicator of the above type that eliminates or greatly reduces problems associated with display fogging.

It is a still further object of the present invention to provide a load cell indicator of the above type that provides superior protection against water infiltration while providing easy access to a number of its components.

It is a still further object of the present invention to provide a load cell indicator of the above type that eliminates the need for external summing circuits or boxes or analog to digital converters.

It is a still further object of the present invention to provide a load cell indicator of the above type that protects many key, sensitive components of the indicator by adhesively sealing them within a watertight enclosure.

It is a still further object of the present invention to provide a load cell indicator of the above type that provides for easy customization and updating of software code inside the indicator and for easy data transfer to and from the indicator without the need to gain physical access to any indicator enclosure.

It is a still further object of the present invention to provide a load cell indicator of the above type that provides for easy calibration of the indicator without the need to gain physical access to any indicator enclosure.

It is a still further object of the present invention to provide a load cell indicator of the above type that may be powered by AC power or by an internal battery.

It is a still further object of the present invention to provide a load cell indicator of the above type that provides users with ready access to some components of the indicator for easy installation and maintenance and some troubleshooting while protectively sealing other components in an inaccessible enclosure.

Toward the fulfillment of these and other objects and advantages, the present invention involves an electronic digital controller, such as a load cell indicator, in which a number of components, such as a circuit board, display, and keypad are placed within an enclosure, and the enclosure is bonded closed, such as using an adhesive, to render the enclosure watertight. The keypad is a touch sensitive, capacitive keypad with no moving parts, and it is housed behind a rigid panel. An optoelectronic transceiver allows for data exchange with an electronic memory device housed in the adhesively sealed enclosure and allows for data exchange and for updating or modification of software code housed therein. Other components, such as another circuit board, a power supply, and block connectors, are placed in an adjacent enclosure, and the circuit boards in the two enclosures are electrically connected. The power supply is preferably a potted AC power supply but may also include a battery.

BRIEF DESCRIPTION OF THE DRAWINGS

The above brief description, as well as further objects, features and advantages of the present invention will be more fully appreciated by reference to the following detailed description of the presently preferred but nonetheless illustrative embodiments in accordance with the present invention when taken in conjunction with the accompanying drawings, wherein:

FIG. 4 is a front view of a partially disassembled rear enclosure of a load cell indicator of the present invention; and FIG. 5 is a front view of a partially disassembled rear enclosure of an alternate embodiment of a load cell indicator of the present invention.

DETAILED DESCRIPTION OF THE PREFERRED EMBODIMENT

Figure 1:
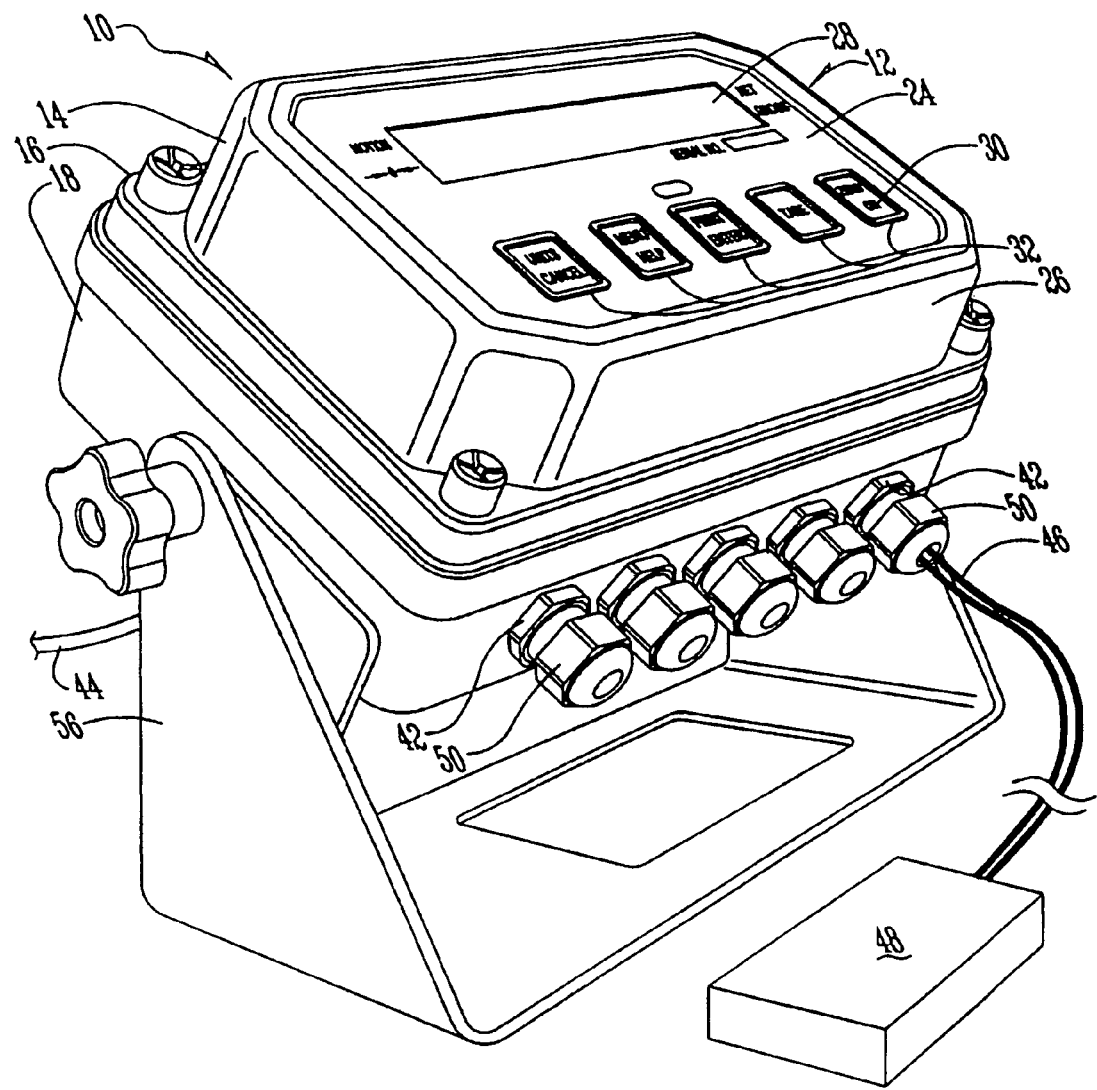
FIG. 1 is a side elevation view of a load cell indicator of the present invention.
Figure 2:
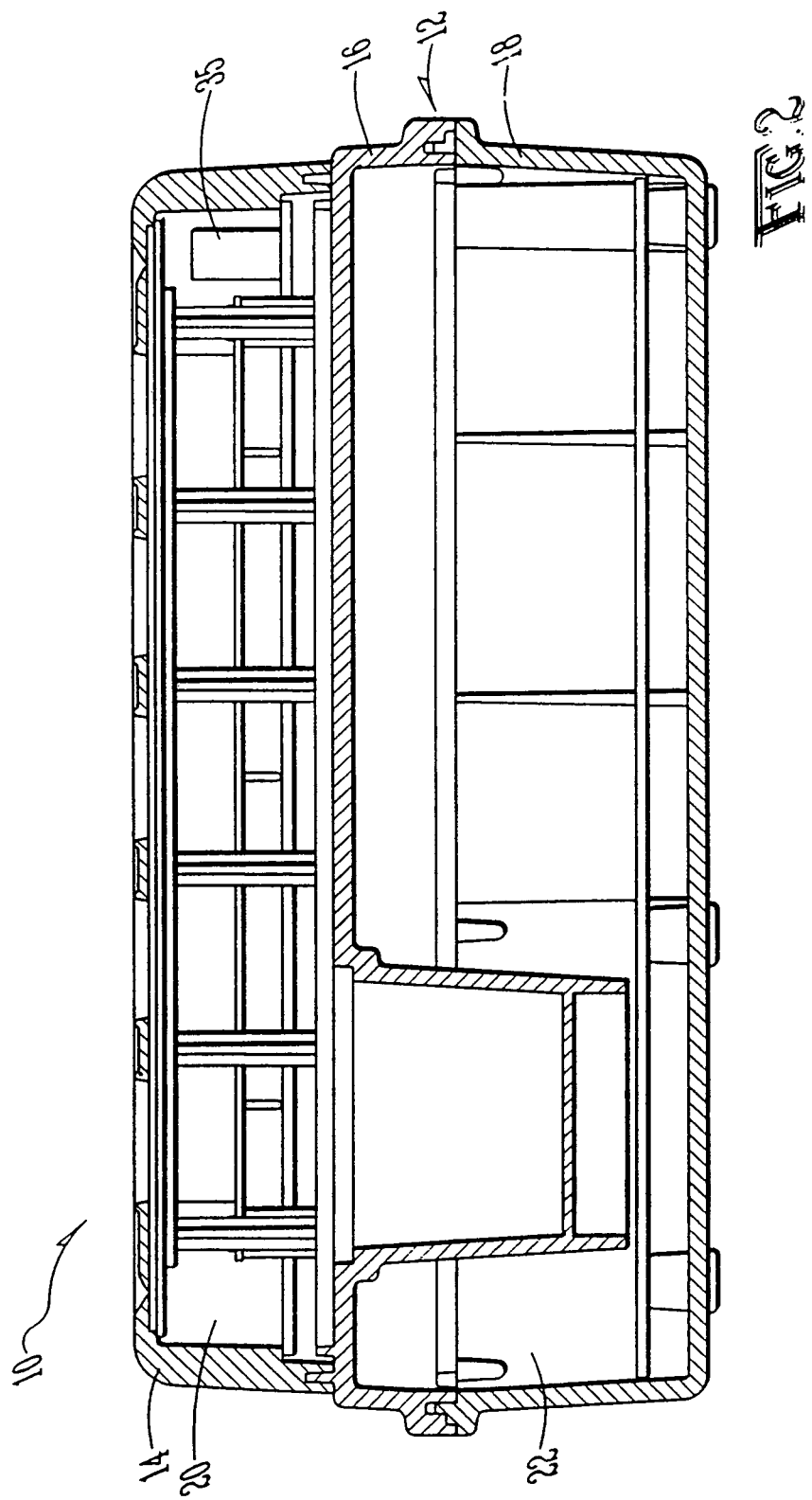
FIG. 2 is a sectional view of a load cell indicator of the present invention.
Figure 3:
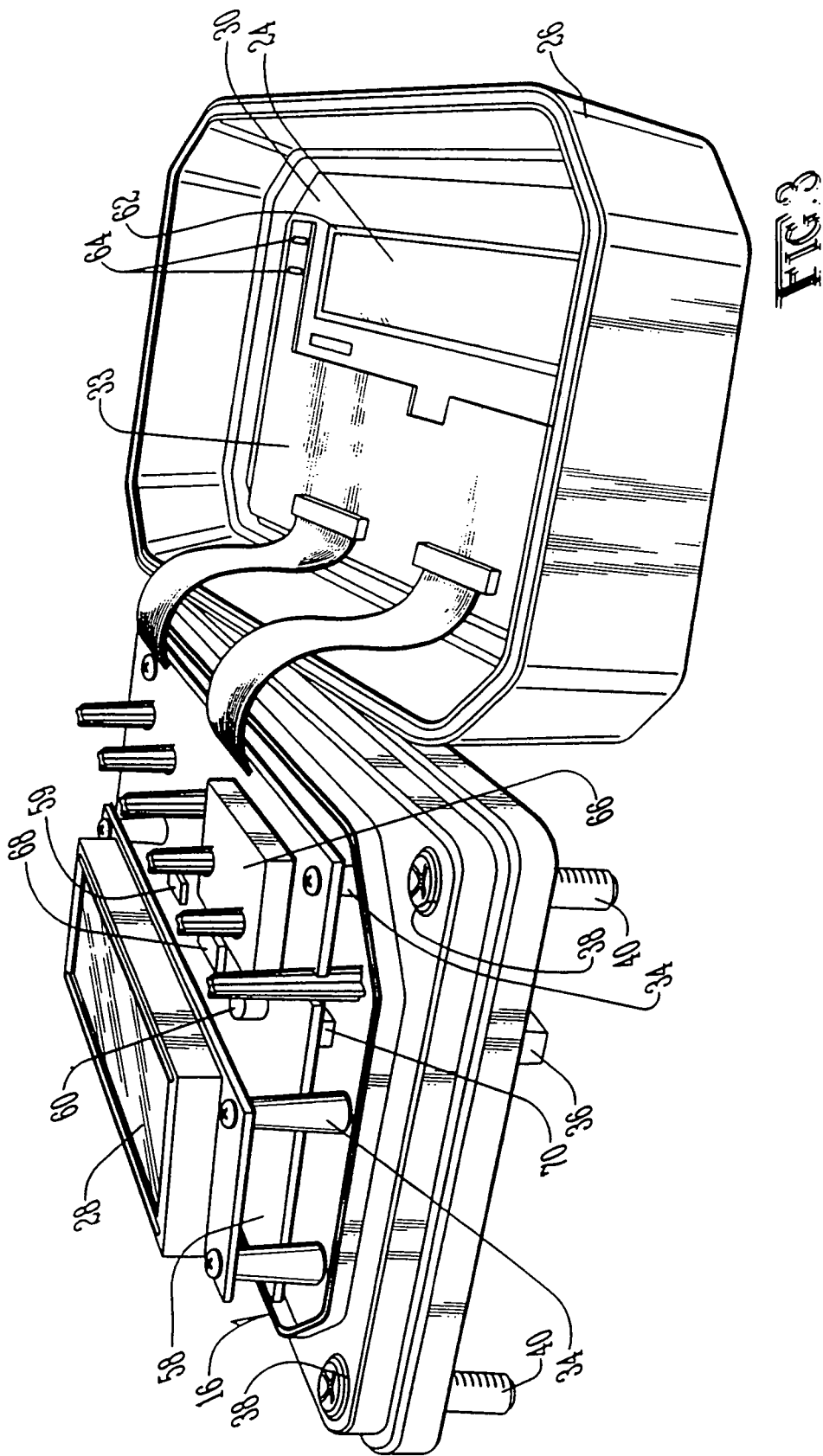
FIG. 3 is a side elevation view of a partially disassembled front enclosure of a load cell indicator of the present invention.

Referring to FIG. 1, the reference numeral 10 refers in general to an electronic digital controller, such as a load cell indicator, of the present invention. The indicator 10 has a housing 12 comprised of a front cover 14, a base 16, and a rear cover 18 that are formed from molded plastic and that fit together to form front and rear enclosures 20 and 22 that house various components of the indicator 10.

The front cover 14 is formed by a front panel 24 and a side panel or bezel 26. The front panel 24 is produced from a transparent, rigid plastic to allow a display 28 and front panel legends 30 to be visible from outside the enclosure. The front panel 24 also has one or more areas of reduced thickness 32 aligned with keys or touch sensitive areas of a keypad 33 disposed inside the front enclosure 20. The areas of reduced thickness 32 are formed integrally with the remaining portion of the front panel 24 and are also rigid. The front panel 24 is bonded, such as by adhesive bonding, to the side panel 26 about substantially its entire perimeter to form a watertight seal. The side panel 26 is bonded to both the front panel 24 and the base 16. A back edge of the side panel 26 and front surface of the base 16 mate together with a tongue and groove fitting, and the side panel 26 is bonded to the base 16 about substantially the entire perimeter of the tongue and groove fitting to form a watertight seal. It is of course understood that the front cover 14 may be formed as a single piece or as any number of different pieces and that it may take any number of different shapes, sizes, or configurations. As used herein, it is understood that the term "bond" or "bonding" encompasses a variety of different methods of forming a watertight seal between two joined work pieces, including but not limited to the use of adhesives or welding. For example, any number of different adhesives may be used, including but not limited to a wide variety of glues, resins, epoxies, tapes, or foams. Similarly, any number of different welding techniques may be used, including but not limited to ordinary welding, ultrasonic welding, and solvent welding.

The base 16 has any number of bosses 34 extending from its front surface for securing various components to be housed in the front enclosure 20. For reasons to be described, a chute 36 is formed integrally with and extends from a rear surface of the base 16. A back edge of the base 16 and a front edge of the rear cover 18 mate together with a tongue and groove fitting. A gasket, O-ring, or similar sealing members are used in combination with the tongue and groove fitting to provide a water resistant seal. Holes 38 pass through an outer periphery of the base 16, disposed outward of the tongue and groove fittings so that the holes 38 do not provide points of entry into either enclosure. Captive screw fasteners 40 pass through the holes 38 and are captively retained by the base 16. The front panel 24, side panel 26, and base 16 form and bound the front enclosure 20. These components are permanently bonded and sealed to prevent any fluid infiltration into the front enclosure 20, and the front cover 14 and base 16 are adapted so that a user may not gain physical entry to the front enclosure 20 without breaking, cutting, or otherwise piercing the base 16 or front cover 14. Similarly, the adhesive selected preferably will not allow a user to overcome the adhesive bond to gain physical access to the front enclosure 20 and will instead require a user to break, cut, or otherwise pierce the base 16 or front cover 14 to gain physical entry to the front enclosure 20.

The rear cover 18 has one or more openings or ports 42 along its sides or back surface to provide one or more points of entry into the rear enclosure 22 for things such as an AC power cord 44, wires or cables 46 from load cells 48, and any number of other types of optional communications cabling, such as to a printer, computer, another load cell indicator, remote display, or other peripheral hardware. Seals, gaskets, or any other number of water resistant closures 50 may be used in combination with these ports 42 to keep moisture from entering the rear enclosure 22. The rear cover 18 has any number of bosses 34 extending from one or more of its inner surfaces for securing various components to be housed in the rear enclosure 22. Inner partitions 52 also extend from one or more inner surfaces of the rear cover 18 to provide for further isolation of components in the rear enclosure 22. Threaded bores or holes 54 pass through an outer periphery of the rear cover 18, disposed outward of the tongue and groove fitting so that the bores 54 do not provide points of entry into the rear enclosure 22. The threaded bores 54 provide locations for attachment of the screw fasteners 40 so that the fasteners 40 may provide for compression of the O-ring type sealing gasket. The rear surface of the rear cover 18 also has a plurality of threaded bores to provide means for attaching the indicator 10 to external panels, braces, or the like 56. These threaded bores do not open into the rear enclosure 22 so that they do not provide possible locations for moisture to enter into the rear enclosure 22. The rear cover 18 and base 16 form and bound the rear enclosure 22.

The front enclosure 20 contains the majority of the electronics for the indicator 10, such as the main circuit board 58, display 28, keypad 33, microprocessor 59, electronic memory device, optoelectronic transceiver 60, analog to digital converter, and the like. The main circuit board 58 is affixed to bosses 34. Since the front enclosure 20 is sealed, and the front panel 24 is formed of a rigid plastic, there is no provision for an industry standard membrane keypad or mechanical switches. A thin opaque pre-printed polycarbonate graphic legend 30 is attached with an optically clear adhesive to the inside of the front panel 24. This graphic legend 30 provides for front panel 24 nomenclature, which may include such information as a stylized company and product logo, model name or number, keypad button descriptions, and labels for the various LED indicators. The graphic layer has a window cutout 62 to allow the display 28 to be visible. It is of course understood that the graphic legend 30 may be printed directly onto the front panel 24.

Adhered to the graphic legend plastic is the touch sensitive keypad 33 circuit board, preferably a capacitive, touch sensitive keyboard 33 circuit board. One side of this keypad 33 circuit board, which is attached to the graphic layer, is composed of five conductive sensing areas that serve as the touch sensitive buttons. The other side of the keypad 33 circuit board contains the surface mount electronic components, which sense the absence or presence of a finger and translate this to the main circuit board 58 as a key press. In this manner, the user can simply touch his finger against certain spots on the outside of the front panel 24 to initiate a key press. Because this keypad 33 contains no moving parts, and the electronic components of the keypad 33 are located inside the sealed front enclosure 20, it cannot be easily damaged or worn out. Although a capacitive touch sensitive keypad 33 is preferred, other touch sensitive keypads may be used, such as for example a reflective optical sensing keypad, which detects whether or not a person's finger is present on the sensing spot. Placing the graphic legend 30 inside the transparent front panel 24 also serves to protect the markings and nomenclature from abrasion and physical wear, and adhering the graphic legend 30 to the transparent front panel 24 also reduces or eliminates fogging problems with respect to information shown on the graphic legend 30. A small package 35 containing moisture-absorbing desiccant material is also placed inside the front enclosure 20 during assembly. The desiccant package 35 helps to ensure that the air contained in the front enclosure 20 stays dry, which prevents any condensation from occurring on the inside of the transparent front panel 24.

The keypad 33 circuit board can also contain several small LEDs 64. Typically, these are lit to indicate scale operating parameters, such as net, gross, or tare weight, weight in motion, or center of zero weight. When illuminated, the LEDs 64 are visible through the graphic legend 30 layer.

The display 28, which is a backlit liquid crystal character mode dot matrix display, is physically mounted by screw fasteners on four molded bosses 34 of the base 16. It is electrically connected to the main circuit board 58 by soldering during assembly of the indicator 10. The display 28 of the assembled indicator 10 is visible through the transparent front panel 24 and the window cutout 62 of the graphic legend 30 layer. Circuits on the main circuit board 58 and software routines allow the user to adjust the backlight and contrast of the display 28 for good visibility in all lighting conditions. The user may also elect to disable the backlight to conserve power and lengthen the battery life.

An IrDA compliant optoelectronic transceiver 60 circuit is included on the main circuit board 58. Together with other support circuitry on the circuit board and software, this transceiver 60 allows for serial bidirectional infrared data communications with various external hardware devices. This data communication protocol is optical and non-contact, so the indicator user can initiate a data transfer with the indicator 10 by pointing a device such as a handheld personal computer/organizer at the indicator front panel 24 and executing the appropriate software routines.

An analog to digital converter component 66 is also included in the front enclosure 20, electrically connected to the main circuit board 58. The converter 66 was chosen in part for its ability to connect to multiple analog input signals. This allows for the option of interfacing with multiple independent load cells 48. Software routines may be present to calibrate and compensate each load cell 48 signal independent of the other load cells. Software routines may also be present to sum the signals digitally if necessary. If an application uses two or more load cells 48 as independent sensors, and the indicator 10 is programmed to simulate multiple scales, applying a weight to one load cell 48 has no effect on any other load cell 48 in the system. In this situation, summing is not needed. If an application uses multiple load cells 48 attached to a common weighing device so that an object to be weighed will deflect multiple load cells 48, the software routines may be used to sum the inputs from the multiple load cells 48 and to calculate the total weight on the weighing device. In this type of application, software routines are present to calibrate and compensate each load cell 48 signal independent of the other load cells. In most cases, the ability to interface with multiple load cells 48 eliminates the need for external analog summing circuits or boxes. If a summing circuit or box is used, software routines may also be provided that will serve as a digital replacement for an external analog summing circuit, eliminating the time-consuming drudgery of manually balancing load cell 48 inputs such as from a floor scale weighing platform.

One or more electronic memory devices 68, such as a flash memory device may be provided in the front enclosure 20, electrically connected to the main circuit board 58, for storage of software programs and data. With proper software routines, the memory device 68 can be easily erased and reprogrammed without disassembly. If the infrared data communications channel is used to transfer the new software to the indicator 10, the entire indicator software can be upgraded without error in the field by a technician or user in minutes.

A connector 70, such as a 30-pin dual row connector, is electrically connected to the main circuit board 58 and extends into the chute 36. A portion of the connector 70 is exposed outside of the rear surface of the base 16 for mating connection with a connector 72 that is affixed to an interface circuit board 74. The chute 36 is sealed, such as with an epoxy or resin, which forms a watertight seal around the connector. The chute 36 also has to protect the connector 70. In that regard, three grooves are provided in the chute 36 that will only mate with corresponding ramped tabs in the rear cover 18 if the two halves are correctly positioned. Any misalignment of the two halves will prevent the tabs and grooves from engaging. This, and the fact that the chute 36 extends past the end of the connector 70 pins, protects the connector 70 pins from damage.

It is of course understood that any number of different combinations of components may be disposed in the front enclosure 20 and that not all features or elements discussed above need to be enclosed in the front enclosure 20.

The physically accessible rear enclosure 22 contains components to which a user will typically need access in the field. Because it is accessible and not permanently sealed, it is purposely of simple design. The interface circuit board 74 is located in the rear enclosure 22. Further, a few components that will typically be disposed in the rear enclosure 22, electrically connected to the interface circuit board 74, include one or more terminal block style connectors 76 or rows of such connectors for external devices, and connectors 78 and 80 for the power supply 82 and optional battery 84. The interface circuit board 74 can also provide an LED indicator that illuminates when the power supply 82 is energized, electrical components for transient voltage suppression, and optically isolated modules 88 for controlling external input and output devices. The connector 72 is also provided, electrically connected to the interface circuit board 74, for mating with the connector 70. All electrical connections to the load cell indicator 10 are made through the interface circuit board 74, which is mounted in the rear enclosure 22. This interface circuit board 74 is accessible to the user for wiring external devices by removing the sealed front half of the indicator 10.

A power supply 82 section is provided in an upper region of the rear enclosure 22 for receiving high voltage AC power and for providing appropriate voltage reduction. The power supply 82 section is set apart from other components in the rear enclosure 22 by the partitions 52. The power supply 82 section contains a watertight electrical connector that extends through an opening in the back surface of the rear cover 18 for receiving the incoming AC power supply (normally 120 VAC). To protect against moisture contacting any high voltage wiring inside the rear enclosure 22, the power supply 82 is potted in an electronic grade epoxy 90. When the power supply cord 44 is attached, there is no exposed high voltage (>24 VAC) within the rear enclosure 22 or front enclosure 20, which reduces the possibility of damage should moisture make its way into the indicator 10. Placing the power supply 82 in an upper region of the rear enclosure 22 also reduces the risk that water that may enter and gather in a bottom portion of the rear enclosure 22 will come into contact with the power supply 82.

Because the indicator 10 is also intended for portable use, a sealed lead acid battery 84 may also be mounted in the rear enclosure 22, preferably in an upper region thereof If a battery 84 is provided, the battery 84 will typically only provide power for the electronic circuits when the internal power supply 82 is not energized by the AC line. Charging the battery 84 can be accomplished in at least two ways. One method would be to disconnect the latching battery connector 80 from the interface board, remove the battery 84 from the rear enclosure 22, and attach the battery 84 to an external charging device. This method has the advantage that batteries can be swapped quickly and the load cell indicator 10 placed back in service within several minutes. The more common method of battery charging is to provide AC power to the indicator, which will energize the internal power supply contained in the rear enclosure 22. The power supply 82 is designed to simultaneously power the indicator electronics and charge the battery 84. This method is commonly used for a semi-portable installation, where the user normally provides AC power to the indicator 10 and only requires portable operation on occasion.

In operation, a user will loosen the captive screw fasteners 40 to remove the rear cover 18 from the base 16, gaining access to the rear enclosure 22. The user will pass one or more cables 46 from measuring transducers 48, such as load cells, through the ports 42, electrically connect the cables 46 to the terminal block style connector 76, and ensure that the water resistant closures 50 are sealed to inhibit or prevent the entry of moisture through the ports 42 and into the rear enclosure 22. A battery 84 may be installed or replaced, or the battery may be connected to or disconnected from the connector 80. The user then mates the front and rear connectors 70 and 72 and fastens the rear cover 18 to the base 16 using the captive screw fasteners 40 to compress the O-ring type seal and form a water resistant seal to inhibit or prevent the entry of moisture into the rear enclosure 22. If outside AC power is required, the user plugs the external power cord 44 into an outlet. The user may then set up the indicator 10 to provide the desired display format using the keypad 33 and the optoelectronic transceiver 60. The user may also enter or retrieve data or enter, revise, or replace software routines or code using the keypad 33 and the optoelectronic transceiver 60. Although not preferred, it is understood that a user may enter or retrieve data or enter, revise, or replace software routines or code using other serial communications ports/channels, such as by using a cabled connection to make an electrical connection to the interface circuit board 74 in the same manner load cells 48 are connected, to terminals on terminal blocks 76.

In this manner, the indicator 10 of the present invention overcomes weaknesses found in previous load cell indicators. For example, the permanently sealed front enclosure 20 containing the main circuit board 58 is protected from moisture and environmental contamination. The power supply 82 is potted in epoxy 90 to prevent fluids from coming into contact with the high voltage AC power supply 82. The usual causes of keypad 33 damage and wear are eliminated by the touch sensitive keypad 33 circuit and rigid polycarbonate front panel 24. Reasonable battery life, excellent display 28 visibility and readability, and long display lifetime are provided by the choice of a backlit liquid crystal display. The display 28 is mounted in the permanently sealed front half of the enclosure, so there is no opportunity for display fogging or condensation. The use of captive screw fasteners 40 to clamp the front and rear halves of the indicator 10 allows for a technician to have quick access to the electrical terminals 76 for wiring external devices, such as load cells 48. The ability to interface with multiple load cells 48 eliminates in most cases the need for external analog summing boxes. Connection to external data communication devices is facilitated by multiple serial communication ports and the ability to quickly and easily update the load cell indicator software. The software update mechanism also allows for modifications should the indicator 10 be integrated into other systems. The sealed front enclosure 20 is not user serviceable, so highly skilled technicians are not required to troubleshoot and repair the indicator 10.

Other modifications, changes and substitutions are intended in the foregoing, and in some instances, some features of the invention will be employed without a corresponding use of other features. For example, the indicator 10 may include or omit a battery 84 or may include or omit an AC power supply 82. Further, the sealed front enclosure 20 may contain any number of different combinations of elements and need not contain all of the elements as described in the preferred embodiments discussed above. Further still, although the above discussion related primarily to load cells 48 and load cell indicators 10, it is understood that the controller 10 of the present invention make take any number of different configurations and may be used in connection with any number of different devices and measuring transducers 48. Also, although a touch sensitive capacitive keypad 33 is preferred, any number of different keypads 33 or data entry means may be used, and the keypad 33 may be disposed in any number of locations, including externally. It is also understood that the entire disclosure of U.S. Provisional Patent Application Ser. No. 60/350,297, filed on Jan. 16, 2002, is incorporated herein by reference. Of course, quantitative information is included by way of example only and is not intended as a limitation as to the scope of the invention. Accordingly, it is appropriate that the invention be construed broadly and in a manner consistent with the scope of the invention disclosed.

What is claimed is:
1. A scale or load cell controller, comprising:
 a housing comprising:
  a front display unit including a front housing, a back housing attached with a watertight seal to the front housing, and a lens affixed to the front housing, the front display unit defining an interior region housing scale or load cell controller electronics in a sealed enclosure; and a rear interface and mounting unit removably affixed to the front display unit for mounting the housing to a surface, the rear interface and mounting unit providing an interface for electrical communication between within the housing and one or more devices or communications cabling disposed outside of the housing, wherein one or more measuring transducers or load cells located external to the housing are electrically connected to the scale or load cell controller through the rear interface and mounting unit.

2. The scale or load cell controller of claim 1, wherein the back housing is bonded to the front housing so that the interior region is watertight.

3. The scale or load cell controller of claim 2, wherein the back housing is adhesively bonded to the front housing so that a user may not gain physical entry to the interior region without breaking, cutting, or otherwise piercing the front display unit.

4. The scale or load cell controller of claim 1, wherein the rear interface and mounting unit is affixed to the front display unit to form a water resistant rear enclosure.

5. The scale or load cell controller of claim 1, wherein the rear interface and mounting unit includes a rear enclosure defining an area which supports a battery pack, a power supply, and an interface circuit board.

6. The scale or load cell controller of claim 5, wherein the rear interface and mounting unit includes a mounting bracket affixed to the rear enclosure for mounting the housing on the surface.

7. The scale or load cell controller of claim 6, wherein the housing is pivotal with respect to the mounting bracket.

8. The scale or load cell controller of claim 6, wherein the mounting bracket allows pivoting of the housing with respect to the surface.

9. The scale or load cell controller of claim 1, wherein the front display unit supports a display visible through the lens and a plurality of input keys actuatable by pressing predetermined regions of the lens.

10. The scale or load cell controller of claim 9, wherein controller circuitry, the display, and the plurality of input keys are supported by the back housing.

11. The scale or load cell controller of claim 9, wherein controller circuitry, the display, and the plurality of input keys are mounted to the back housing.

12. The scale or load cell controller of claim 9, wherein a front surface of the lens includes recesses corresponding to the predetermined regions of the lens.

13. The scale or load cell controller of claim 9, further comprising a lens support member.

14. The scale or load cell controller of claim 13, wherein the display includes a light emitting diode display.

15. The scale or load cell controller of claim 1, wherein the rear interface and mounting unit is removably affixed to the front display unit with one or more fasteners.

16. The scale or load cell controller of claim 1, wherein the rear interface and mounting unit is sealingly affixed to the front display unit using a tongue and groove fitting and one or more sealing members.

17. The scale or load cell controller of claim 1, wherein the rear interface and mounting unit includes a battery pack and a power supply for supplying power to control the controller electronics of the front display unit.

18. A housing for a scale or load cell controller, the housing comprising:

a front display unit including a front housing, a back housing attached to the front housing and a lens affixed to the front housing, the front display unit defining an interior region housing scale or load cell controller electronics and having a watertight seal between the front and back housings, the scale or load cell controller electronics including a first circuit connector extending through an opening in the back housing; and a rear interface and mounting unit removably affixed to the back housing of the front display unit for mounting the housing to a surface, the rear interface and mounting unit supporting electronic circuitry including an interface circuit board having a second circuit connector adapted to mate with the first circuit connector, the first circuit connector and the second circuit connector mating with one another when the rear interface and mounting unit is affixed to the front display unit to provide for electrical connection between the scale or load cell controller electronics of the front display unit and the electronic circuitry of the rear interface and mounting unit, further comprising a sealed chute extending between the front display unit and the rear interface and mounting unit through which the first and second circuit connector mate.

19. The housing of claim 18, wherein the chute extends past the end of the first circuit connector to prevent damage to the first circuit connector.

20. The housing of claim 18, wherein one or more grooves in a portion of the chute extending from the back housing are adapted to mate with one or more corresponding ramped tabs in the rear interface and mounting unit to ensure electrical connection between the controller electronics of the front display unit and the electronic circuitry of the rear interface and mounting unit when the rear interface and mounting unit is affixed to the back housing.

21. A scale or load cell controller, comprising:

a housing comprising:

a front display unit including a front housing, a back housing attached to the front housing, and a lens affixed to the front housing, the front display unit defining an interior region housing scale or load cell controller electronics and having a watertight seal between the front and back housings, the scale or load cell controller electronics including a first circuit connector extending through an opening. in the back housing; and a rear interface and mounting unit removably affixed to the back housing of the front display unit for mounting the housing to a surface the rear interface and mounting unit supporting electronic circuitry including an interface circuit board having a second circuit connector adapted to mate with the first circuit connector, the first circuit connector and the second circuit connector mating with one another when the rear interface and mounting unit is affixed to the front display unit to provide for electrical connection between the scale or load cell controller electronics of the front display unit and the electronic circuitry of the rear interface and mounting unit; and a measuring transducer or load cell, the measuring transducer or load cell being disposed outside of the front display unit and the rear interface and mounting unit and being electrically connected to the interface circuit board through a port extending through the rear interface and mounting unit.

22. The scale or load cell controller of claim 21, wherein the electronic circuitry of the rear interface and mounting unit includes a battery pack and a power supply for supplying power to the controller electronics of the front display unit.

23. A scale or load cell controller, comprising:
a housing comprising:
a front display unit including a front housing, a back housing attached to the front housing, and a lens affixed to the front housing, the front display unit defining an interior region housing scale or load cell controller electronics and having a watertight seal between the front and back housings, the scale or load cell controller electronics including a first circuit connector extending through an opening in the back housing; and
a rear interface and mounting unit removably affixed to the back housing of the front display unit for mounting the housing to a surface, the rear interface and mounting unit supporting electronic circuitry including an interface circuit board having a second circuit connector adapted to mate with the first circuit connector,
the first circuit connector and the second circuit connector mating with one another when the rear interface and mounting unit is affixed to the front display unit to provide for electrical connection between the scale or load cell controller electronics of the front display unit and the electronic circuitry of the rear interface and mounting unit, and;
a plurality of measuring transducers or load cells, the plurality of measuring transducers or load cells being disposed outside of the front display unit and the rear interface and mounting unit and being electrically connected to the interface circuit board through a plurality of ports extending through the rear interface and mounting unit.

24. The scale or load cell controller of claim 1, wherein the rear interface and mounting unit interfaces with the one or more devices or the communications cabling through one or more openings along its side or back surface.

25. The scale or load cell controller of claim 1, wherein the load cell controller is capable of being utilized to display force or weight data received from the load cell and convert the data from analog to digital format before the data is displayed or used.

26. A housing for a scale or load cell controller, the housing comprising:
a front display unit including a front housing, a back housing attached to the front housing, and a lens affixed to the front housing, the front display unit defining an interior region housing scale or load cell controller electronics and having a watertight seal between the front and back housings, the scale or load cell controller electronics including a first circuit connector extending through an opening in the back housing; and
a rear interface and mounting unit removably affixed to the back housing of the front display unit for mounting the housing to a surface, the rear interface and mounting unit supporting electronic circuitry including an interface circuit board having a second circuit connector adapted to mate with the first circuit connector,
the first circuit connector and the second circuit connector mating with one another when the rear interface and mounting unit is affixed to the front display unit to provide for electrical connection between the scale or load cell controller electronics of the front display unit and the electronic circuitry of the rear interface and mounting unit,
further comprising an analog to digital converter in the front display unit having the ability to connect to multiple analog input signals and interface with multiple independent load cells or measuring transducers.

27. The housing of claim 26, further comprising software routines in the scale or load cell controller electronics to calibrate and compensate each load cell signal or measuring transducer signal independent of other load cells or measuring transducers.

28. The housing of claim 26, further comprising software routines in the scale or load cell controller electronics to sum the signals digitally.

29. The scale or load cell controller of claim 1, wherein the one or more measuring transducers or load cells are disposed outside of the front display unit and the rear interface and mounting unit and are electrically connected to the interface circuit board through a port extending through the rear interface and mounting unit.

* * * * *